(12) United States Patent
Yamada et al.

(10) Patent No.: US 6,614,050 B1
(45) Date of Patent: Sep. 2, 2003

(54) SEMICONDUCTOR MANUFACTURING APPARATUS

(75) Inventors: Keizo Yamada, Tokyo (JP); Tohoru Tsujide, Tokyo (JP)

(73) Assignee: Fab Solutions, Inc. (JP)

( * ) Notice: Subject to any disclaimer, the term of this patent is extended or adjusted under 35 U.S.C. 154(b) by 0 days.

(21) Appl. No.: 09/696,272

(22) Filed: Oct. 25, 2000

(30) Foreign Application Priority Data

Oct. 26, 1999  (JP) ........................................... 11/304387

(51) Int. Cl.⁷ ............................................... H01L 23/58
(52) U.S. Cl. .................................................... 257/48
(58) Field of Search .......................... 438/14; 382/149; 364/552; 414/416; 700/110; 219/405; 257/48

(56) References Cited

U.S. PATENT DOCUMENTS

| | | | | |
|---|---|---|---|---|
| 5,128,737 A | * | 7/1992 | Have ............................ | 357/40 |
| 5,696,689 A | | 12/1997 | Okumura et al. ....... | 364/468.28 |
| 5,801,965 A | * | 9/1998 | Takagi et al. ................ | 364/552 |
| 5,955,383 A | | 9/1999 | Hwang ........................ | 438/729 |
| 6,208,751 B1 | * | 3/2001 | Almogy ...................... | 382/149 |
| 6,281,696 B1 | * | 8/2001 | Voogel ........................ | 324/765 |

FOREIGN PATENT DOCUMENTS

| | | | | |
|---|---|---|---|---|
| JP | 7-178654 | 7/1995 | ........... | B23Q/41/08 |
| JP | 9-251304 | 9/1997 | ........... | G05B/13/04 |
| JP | 10-242231 | 9/1998 | ........... | H01L/21/66 |
| JP | 11-219874 | 8/1999 | ........... | H01L/21/02 |
| WO | WO 98/54632 | 12/1998 | | |

* cited by examiner

Primary Examiner—John F. Niebling
Assistant Examiner—Andre C Stevenson
(74) Attorney, Agent, or Firm—Hayes Soloway P.C.

(57) ABSTRACT

A semiconductor manufacturing apparatus, which performs predetermined processing for a group of wafers supplied by a preprocessor that performs preliminary processing, comprises a data storage unit for storing wafer processing history data received from the pre-processor, a target value storage unit for storing a processing target value for the semiconductor manufacturing apparatus, an identification unit for identifying a wafer supplied by the pre-processor, a processor for employing the wafer processing history data and the processing target value to determine processing conditions for the wafer identified by the identification unit, a conveying unit for transporting the wafer from the identification unit to a wafer processor, a controller for controlling the wafer processor in accordance with the wafer processing conditions instructed by the processor, and a determination unit for examining the condition of the wafer that has been processed by the wafer processor to determine whether the wafer is good or bad, wherein, in accordance with the results obtained by the determination unit, the processor determines whether the processing of the wafer is to again be performed by the wafer processor, and as necessary, again sets the processing conditions.

10 Claims, 14 Drawing Sheets

| FACTOR | VALUE |
|---|---|
| THICKNESS | |
| DISPERSION | |
| DIAMETER AT BOTTOM OF HOLE | |
| DISPERSION | |
| OPENING DIAMETER | |
| DISPERSION | |
| FOREIGN SUBSTANCE | |

INSPECTION DATA

SEMICONDUCTOR MANUFACTURING APPARATUS

BACKGROUND OF THE INVENTION

1. Field of the Invention

The present invention relates to a semiconductor manufacturing apparatus, and relates in particular to a semiconductor manufacturing apparatus concerning a series of processes for manufacturing a semiconductor product.

2. Description of the Prior Art

Conventional semiconductor production is centered around the mass production of a small variety of devices, mainly memories and general-purpose logic products. Currently, small jobs for the production of specific types of devices, products that incorporate a system, such as ASICs, which are designs specifically adapted to fulfill the application needs of certain customers or to provide products that customers have expressed a need for, can only performed at intervals between the processing devoted to the mass production of standard devices. However, a system-on-silicon arrangement has recently been developed, and the production of product types where entire systems are mounted on single chips gradually increasing. While conventionally there are no memory-mounted semiconductor products, where memory is mounted on logic devices, techniques for mounting both logic circuits and memory on the same chip are requisite if an entire system is to be mounted on a single chip.

For the manufacture of semiconductor devices today, when the emphasis is on the production of a small variety of products, because of expansions in the sizes of substrates and reductions in the sizes of wiring, increases in the number of chips that can be obtained from a single substrate has contributed to a reduction in manufacturing costs. Thus, the current substrate size is approaching 300 mm, and as a result of means developed to reduce the size of wiring, all companies are now able to attain wire sizes down to 0.18 µm.

For ASICs, gate array devices and cell base devices are the primary types produced, and while bases can be used in common, for the gate array devices, wiring must be so arranged that the needs of a variety of customers can be satisfied.

For a gate array ASIC, a common base is used and only the wiring must be arranged so as to provide a design that matches the requests of customers; however, since the flexibility available with the design is small, as system sizes increase, so too do the difficulties encountered in fabricating devices that can provide the performances customers demand. Thus, it has been found that when designing an ASIC, a cell base device must be employed. But although with a cell base device the same base can be commonly employed, for this kind of ASIC, a designer must start at the very beginning.

While there are some ASIC products that are fabricated by employing mass production methods, generally, an ASIC is a device that is specially prepared for a single customer, quite unlike a general-purpose product, so that mass production is required for only a few such devices.

In an ordinary process used for the manufacture of semiconductor devices, several tens of silicon substrates are employed as a set (generally called a batch or a lot, and hereinafter referred to as a batch) that must be processed at each step.

Among the product types encountered in small scale production are many products for which the need can be satisfied merely by employing a single silicon substrate as a batch. In this case, several substrates are normally employed as a batch during the manufacturing process.

For large scale production, at least 1000 silicon substrates (20 to 25 batches) for one product type are delivered to a manufacturing line every month.

In the manufacture of semiconductors, the process performed to diffuse an impurity throughout a substrate and the wiring process are the primary operations, and the lithography process and the etching process for partly performing diffusion are associated operations.

A failure during the process can occur as a result, for example, of the performance of excessive or unsatisfactory etching. The occurrence of this phenomenon is due to the difference in an etching condition, or to the deposition of a film that is either too thick or too thin.

A characteristic failure is one that occurs due to a difference in the actual density or the depth of an impurity, attained during the diffusion process, that differs from a design value, or one that is due to an increase in the capacity between wires because they are too thick or to an increase in the resistance in wires because they are too thin.

Generally, these failures are roughly sorted into systematic failures and random failures.

For the large scale production of a small variety of devices, to prevent failures during the individual procedures, a shift away from a central value for a design is monitored either every several batches or each batch. Therefore, for an important procedure, several monitoring substrates are inspected before each batch, or are added to and are processed with batches as they are conveyed along the manufacturing line. However, as the substrate size increases, the system soon becomes too large for the collective manufacturing of semiconductor devices using batch units, and variances in a batch can not be absorbed. Therefore, the employment of production systems for the processing of individual substrates (hereinafter referred to as single wafer processing) has increased. In this case, a monitoring substrate is also employed and inspected for each batch.

As one consequence of a reduction in the sizes of wiring lines, a problem has arisen in that there has been an increase in the failures that are caused by particles (dust) contamination, and since the performance of inspections during the processing contributes to dust contamination, the practice is gradually falling into disuse.

The current semiconductor manufacturing process is performed by using a sheet called a process management slip on which a series of processes are written. Entries on a process management slip describe both a process objective (e.g., a thermally oxidized film one micron thick) and a process condition (e.g., stream oxidization at a ratio of 1 to 1 at a temperature of 1400 degrees for two hours) selected from a recipe that is contained in a correlation table of process conditions and results. When an experiment is conducted for a wafer in the same initial state as one that was used for the preparation of a recipe, and the state of an apparatus that is used is the same as that of the apparatus used for the preparation of the recipe, the same results are accordingly obtained.

However, the semiconductor manufacturing process consists of many steps, and individual wafers have their own processing histories. Thus, the initial state of a wafer supplied for processing is not always the same as that of a wafer used for the preparation of a recipe.

In addition, the internal temperature, the residual gas density, the vacuum level, the amount of energy to be exerted, and the extraneous matter that accumulates on the inner wall of an apparatus gradually vary in consonance with an increase in the number of processed wafers, the number of wafers that are handled at the same time, and the shape of a pattern. Therefore, relative to the processing capacity of an apparatus, the obtained results generally differ, even when the processing is performed under the same conditions as those specified by a standardized recipe. Thus, while a high quality product can be produced if a circuit margin is large, if a high-speed operating circuit is included, the size of a circuit margin is reduced and failures may occur as a result of even a very small procedural error.

Furthermore, the results provided by a process can not be evaluated until an electric test is conducted for a final product, a package into which a chip has been incorporated, so that an extended period of time is required before a failure can be found.

Thus, for products fabricated using large scale production, since a procedure is employed for the processing of a large number of batches before an evaluation of the results can be obtained, many failures occur.

And as for products, such as ASICs, for which small scale production is used, the products can not be delivered to customers on time.

Further, since manufacturing equipment and inspection equipment currently are installed at different locations, someone must be available to select wafers in accordance with the inspection results, and to transfer them to the next processing apparatus. A skilled person is therefore required for this sorting, while the transportation of wafers to a distant location provides even more opportunities for the attachment of dust thereto.

SUMMARY OF THE INVENTION

It is, therefore, one objective of the present invention to provide a semiconductor apparatus for which an inspection apparatus, a manufacturing apparatus, a wafer sorting function and a wafer conveying apparatus automatically perform a series of coordinated processes to produce a product that corresponds to a target.

To achieve the above objective, a semiconductor manufacturing apparatus, which performs predetermined processing for a group of wafers supplied by a pre-processor that performs preliminary processing, comprises:

data storage means for storing wafer processing history data received from the pre-processor;

target value storage means for storing a processing target value for the semiconductor manufacturing apparatus;

identification means for identifying a wafer supplied by the pre-processor;

processor means for employing the wafer processing history data and the processing target value to determine processing conditions for the wafer identified by the identification means;

conveying means for transporting the wafer from the identification means to a wafer processor;

control means for controlling the wafer processor in accordance with the wafer processing conditions instructed by the processor means; and determination means for examining the condition of the wafer that has been processed by the wafer processor to determine whether the wafer is good or bad, wherein, in accordance with the results obtained by the determination means, the processor means determines whether the processing of the wafer is to again be performed by the wafer processor, and as necessary, again sets the processing conditions.

BRIEF DESCRIPTION OF THE DRAWINGS

The above-mentioned purpose, and other objectives, features and advantages of this invention will more readily become apparent when reference is made to the following detailed description, prepared while taking into consideration the accompanying drawings, whereof.

DESCRIPTION OF THE PREFERRED EMBODIMENTS

The preferred embodiments of the present invention will now be described while referring to the accompanying drawings.

Figure 1:
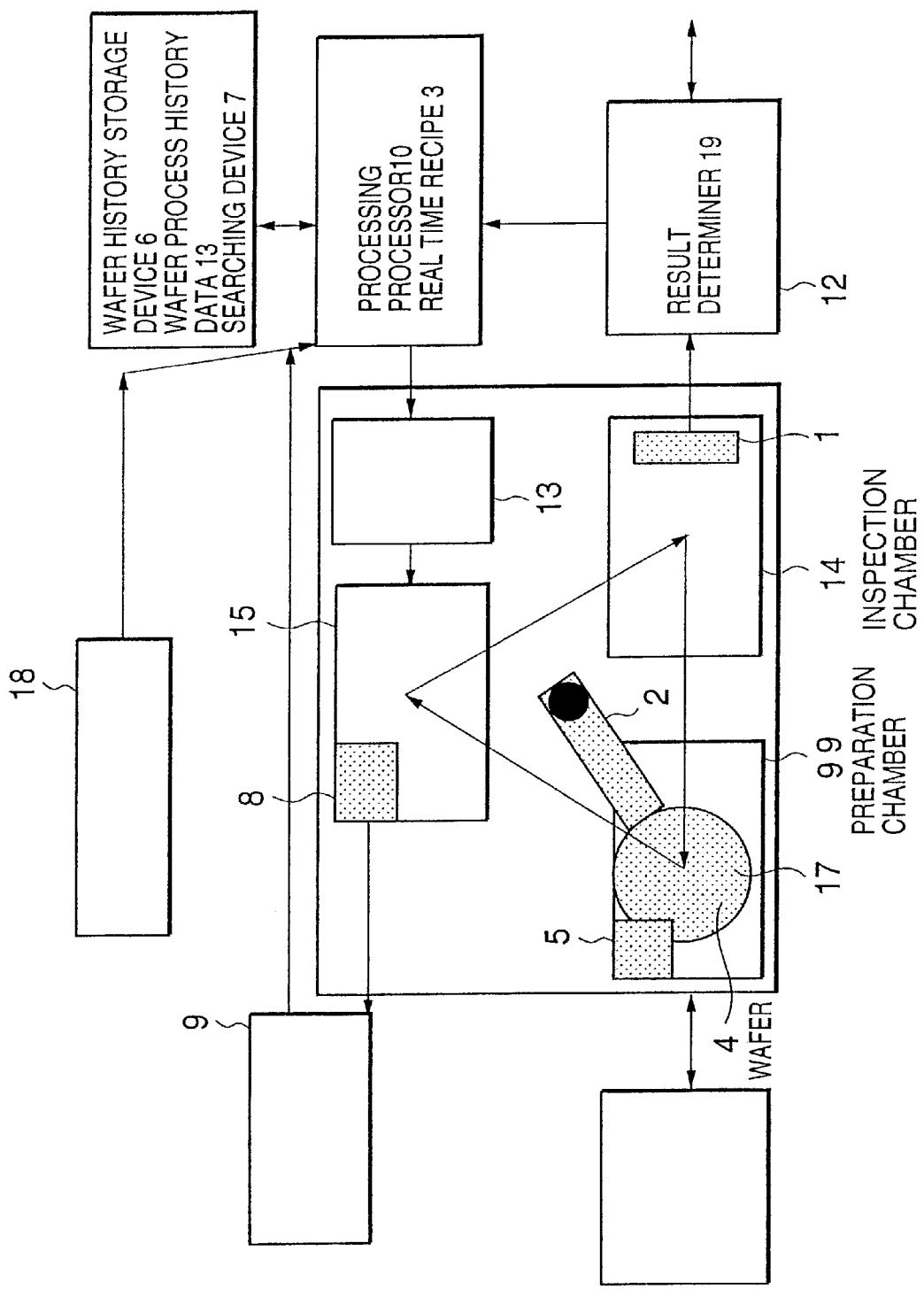
FIG. 1 is a conceptual diagram, according to a first embodiment of the present invention, illustrating an arrangement for a semiconductor processing apparatus using a real time recipe.

According to a first embodiment of the invention, a semiconductor processing apparatus using a real time recipe is constituted by the devices shown in FIG. 1.

Specifically, the semiconductor processing apparatus comprises: a wafer identification device 5, for identifying a wafer to be processed; a wafer history storage device 6, for storing wafer history information; a search device 7, for searching for and fetching wafer history information that has been stored; sensors 8, for monitoring the state of the apparatus; an apparatus state data storage device 9, for storing data obtained by the sensors 8; a process data processor 10, for employing the wafer history information, the state of the apparatus and processing target information to calculate an apparatus processing condition; an inspection device 14, for measuring the processing results; an information processing device 12, for transmitting the measurement results; a process controller 13; a wafer processor 15; and a conveying device 2, such as a robot arm, that also serves as a wafer sorting device. The wafer identification device 5, the wafer processor 15 and the inspection device 14 are integrally located within a range wherein the wafer is transported by the conveying device 2.

This apparatus is operated as follows. First, a batch of wafers to be processed by the semiconductor apparatus is introduced for processing in accordance with the semiconductor manufacturing procedures. Basically, the individual procedures are not performed for each batch, but for each wafer. Therefore, in order to identify the individual wafers, an identification number 17 is provided for each of them. Before the wafer is subjected to the semiconductor manufacturing processing, the tag is provided by inscribing a numeral or a bar code on the wafer using, for example, a laser marker, or by forming a notch in the wafer.

The identification number 17 is used throughout the processing as a management number peculiar to a specific wafer.

All the wafers introduced into the apparatus via preparation chamber 99 pass the wafer identification device 5, which reads their management numbers.

When a wafer passes the wafer identification device 5, the identification device 5 reads the identification number 17 of the wafer, reads data from the processing history storage device 13, and transmits the data to the wafer processor 15. Multiple sensors 8, such as a temperature spectrometer, a pressure spectrometer, a mass spectrometer and an emission spectrometer, are provided for the wafer processor 15 for the management of the state of the apparatus, and the information obtained by these sensors 8 is stored in real time in the apparatus state storage device 9. The processing processor 10 reads the current state of the apparatus from the storage device 9, and a processing target value is read from a device structure file 18, in which a processing target is defined, and is transmitted to the processing processor 10. The processing processor 10 employs these three kinds of information to optimize the parameters for the processing performed by the apparatus.

The optimization of the parameters will now be specifically described. As is described above, wafers are introduced as a batch for the processing.

As an example, an explanation will be given for a case wherein a preceding process that is performed is an insulating film formation step for which the CVD is used, and wherein a contact hole is to be formed at a dry etching step using photolithography.

To form a contact hole in insulating film, the etching time fluctuates in consonance with the thicknesses of insulating films or the sizes of the contact hole openings differ. Further, since the etching condition changes as time elapses, the feedback of data acquired from the processing results for a wafer preceding a current one is also required.

When the first wafer of a batch is to be processed, there is no preceding wafer.

So in this case, the data acquired for the last wafer that was processed under the same conditions, the data for the last wafer that was processed by the specific apparatus, or both sets of these data are fed back.

The processing data acquired at the preceding step for a wafer that is currently being processed and the processing results for the wafer preceding of the current processing are employed for calculation, and the results are transmitted to the process controller 13. The wafer processor 15 then processes the received wafer based on the data output by the processing processor 10.

The resultant wafer is transferred to the inspection device 14 to determine whether a target shape and a target electric characteristic can be obtained, and the inspection results are transmitted to the wafer history storage device 6. The inspection results are also transmitted to a process result determiner 19, which evaluates an error relative to the processing target to determine whether the processing results are satisfactory or not.

As a result of the evaluation, a wafer that can be processed again is re-routed to the wafer processor 15 by the conveying device 2, which is a device such as a robot arm that also performs the sorting function. The processing processor 10 calculates optimal processing parameters by using the results of the inspection of the wafer for which the processing performed was insufficient, the process characteristic of the apparatus, the process history of the pertinent wafer and the current state of the apparatus, all of which are required for re-processing. The obtained parameters are then transmitted to the process controller 13, and the wafer processor 15 re-processes the wafer in accordance with the parameters.

This processing is repeated an appropriate number of times until a wafer in the target processing state is obtained. Wafers that can not be re-processed, such as wafers that are excessively etched, are automatically sorted out so that they will not be conveyed to the next process, and are transferred to another line to be used for failure analyzation or to be abandoned.

All the information accompanying a wafer that has been processed is transmitted with the wafer identification number 17 to the wafer history storage device 6, whereat it is collectively managed.

Figure 2:
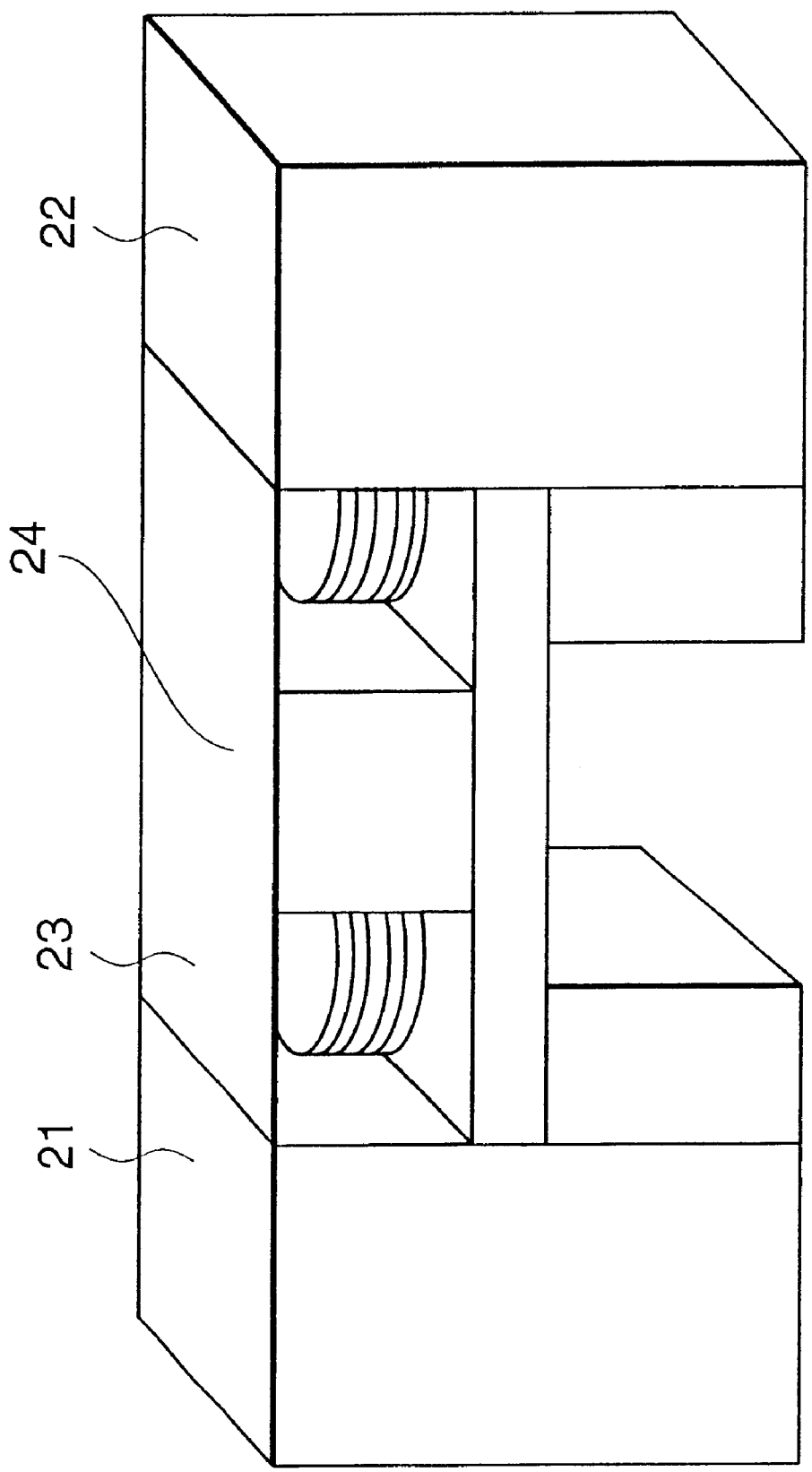
FIG. 2 is a conceptual diagram, according to a second embodiment of the present invention, illustrating an arrangement for a semiconductor processing apparatus using a real time recipe.

FIG. 2 is a diagram illustrating a semiconductor processing apparatus according to a second embodiment of the present invention.

The semiconductor manufacturing process is not always performed in a vacuum. For example, the cleaning process still includes a water cleaning step using a hydrofluoric solution, a nitrite solution, a sulfuric solution, alcohol or pure water. This cleaning step is performed in a water tank located in an ordinary clean atmosphere, and the inspection device that requires the vacuum state, a single container that includes the clean atmosphere area and all the devices employed for the first embodiment are regarded as a single semiconductor processing apparatus.

FIG. 2 is a diagram showing such an inspection apparatus, in which a wafer identification device, a required inspection device and a sorting function are provided at a conveying portion that connects the semiconductor manufacturing devices. Sensors for monitoring the state of the semiconductor processing apparatus are provided in a processing processor 21.

While generally the wafers are individually inspected during the processing, each wafer carrier tends to undergo collective processing for which a solution is used. Therefore, a wafer carrier is temporarily inserted into a load-lock chamber 23 under a vacuum, and wafers are individually extracted, as needed, and are inspected in the inspection chamber 24. Thus, the time a wafer spends in a vacuum can be reduced. In this embodiment, a rough load-lock chamber wherein an entire wafer carrier is temporarily stored in a vacuum, and a vacuum chamber into which an individual wafer is inserted, after being extracted from the wafer carrier, are separately provided.

The time that a wafer spends in a vacuum and the temperature of the wafer affects the state of the wafer surface. Therefore, it is preferable that the time a wafer spends in a vacuum and the temperature of the wafer be managed by using a timer and a thermometer, so that the state of the surface of the wafer can be constantly monitored.

Figure 3:
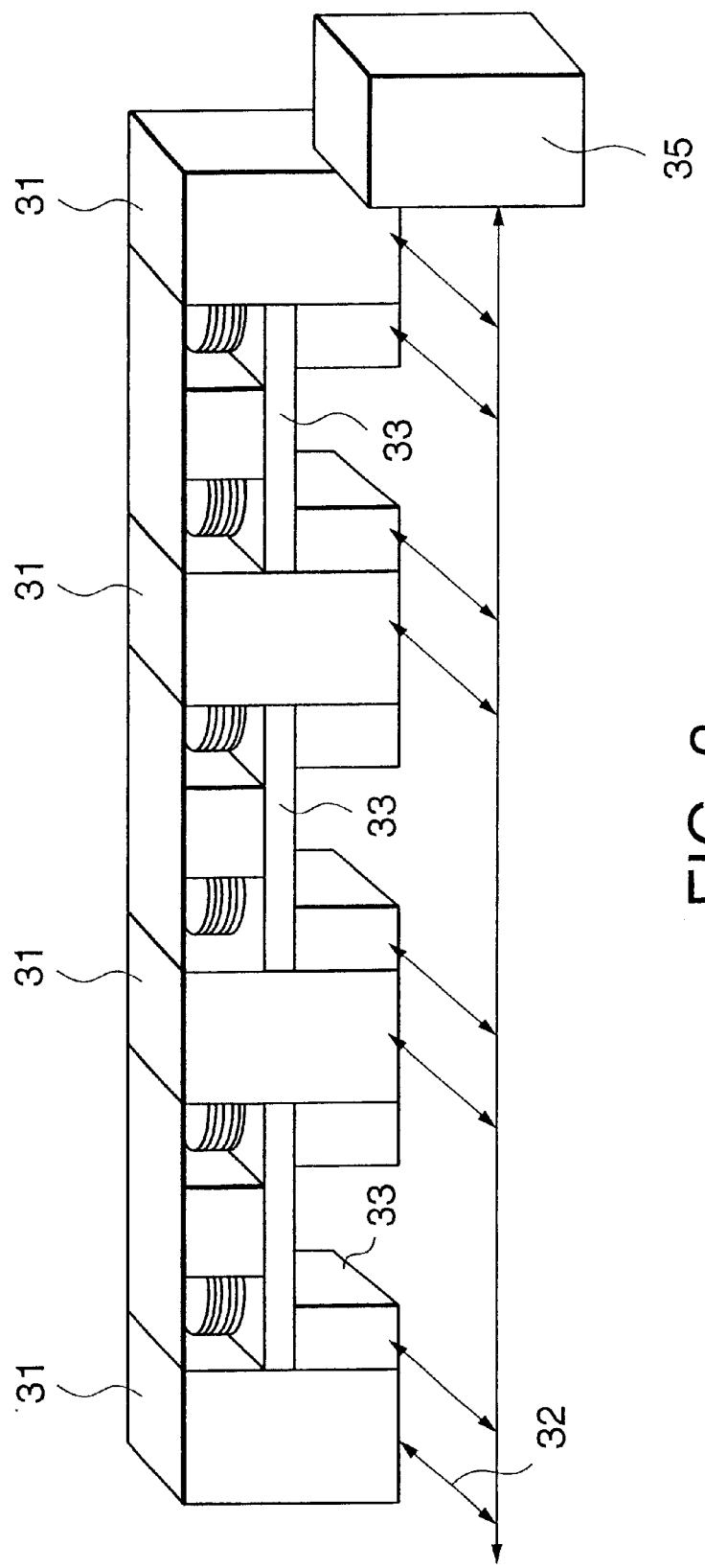
FIG. 3 is a conceptual diagram illustrating a semiconductor production line whereon multiple semiconductor processing apparatuses of the second embodiment are arranged.

FIG. 3 is a diagram showing a semiconductor production line provided by arranging in line a number of the semiconductor manufacturing devices 31 described in the second embodiment. For the individual manufacturing devices 31 and the inspection devices, a data port 34 is provided to obtain, from an external storage device, data concerning the state of the wafer that is acquired by an inspection and the apparatus information acquired by the sensors, or to transmit these data to an external storage device. The data ports 34 are connected by a bi-directional inspection data bus 32, and since there is much electromagnetic noise in a semiconductor factory, it is preferable that the linking for the inspection data bus 32 be provided by an optical LAN that is strong enough to overcome electromagnetic interference.

In FIG. 3, the individual inspection devices are paired with conveying devices to form inspection/conveying devices 33.

Figure 4:
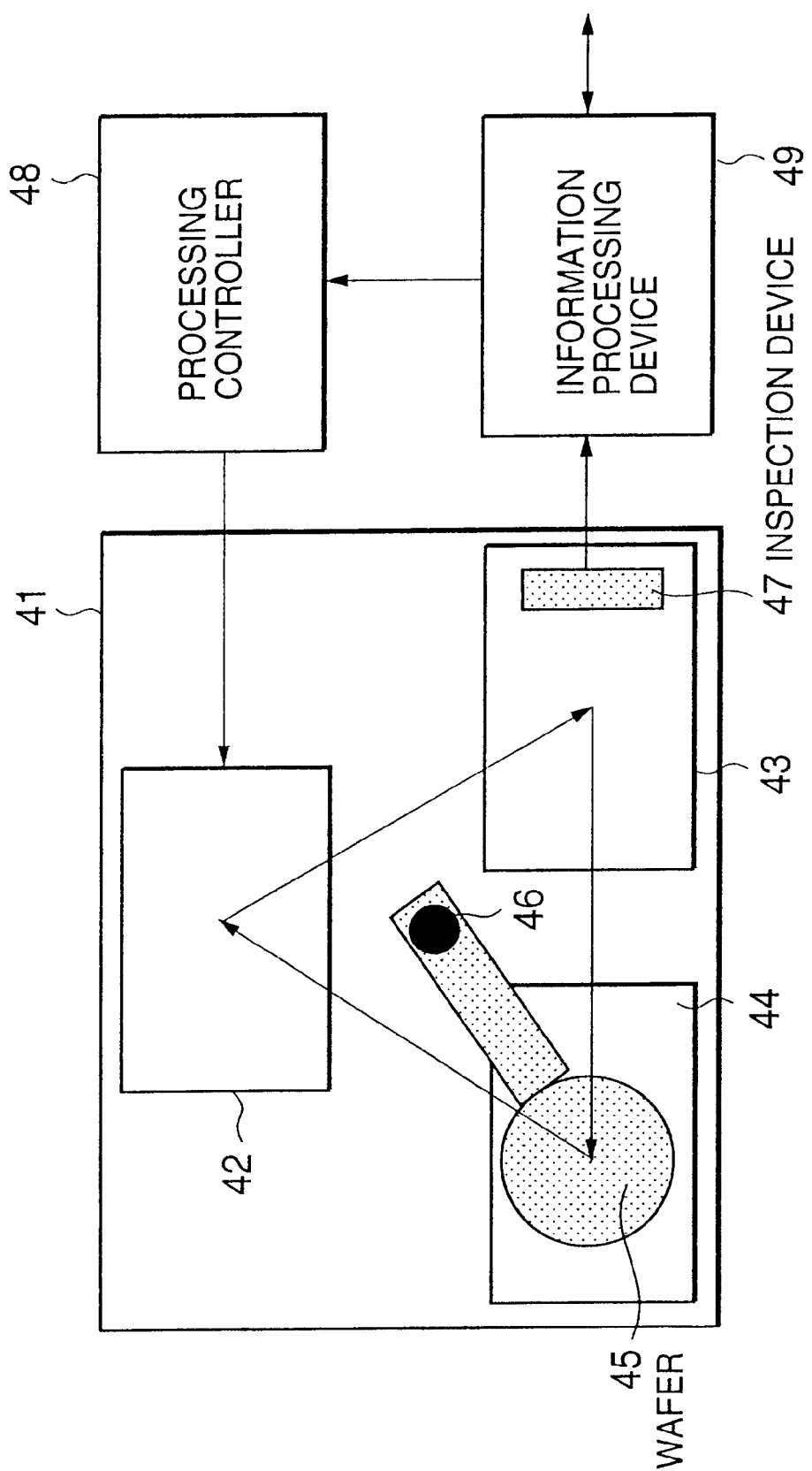
FIG. 4 is a diagram showing a dry etching device to which the present invention is applied.

FIG. 4 is a diagram showing a dry etching device 41 according to a fourth embodiment of the present invention. Since the etching device is a vacuum device, a multi-chambered dry etching device has been developed in order to prevent the generation of unwanted dust.

Generally, three to five chambers can be provided for a multi-chambered etching device and a wafer can be moved among the chambers without the vacuum being lost. The chambers are respectively used as an original etching chamber 42, an inspection chamber 4 and an inspection preparation chamber 44.

During the etching process, a wafer on which a resist pattern has been formed is irradiated by a plasma beam to physically-chemically etch an insulating film, such as an oxide film or a metal film, that has been formed on a silicon substrate.

If a defect, such as dust, is present in a resist pattern that defines a shape to be processed, even though the etching device is operating normally an etching failure occurs locally and the device manufacturing yield is reduced. Therefore, in addition to the devices in the first embodiment, the dry etching device in this embodiment employs a small dust inspection device. Before a wafer 45 that has been introduced into the apparatus is transported to the etching chamber 42, this small dust inspection device examines it for the presence/absence of dust and a pattern defect by scanning it with a laser or an electron beam.

When dust or a defect is found by the inspection, a conveying device 46 automatically returns the wafer 45 to the process by which dust is removed from the surface, or conveys the wafer 45 to a location where the performance of PR process can be repeated.

If no dust or defect is found, the conveying device 46 transports the wafer 45 to the etching chamber 42. Various measurement data are then transmitted to a processing processor, which thereafter prepares optimized etching parameters so that the process is performed in consonance with the objective. In the etching chamber 42, the data is used to control the etching that is performed.

While it would be ideal for the inspection to be conducted immediately after the etching is completed, normally, fluorocarbon is deposited at the etched portion and on the outermost surface of that portion that was not exposed, so that performing an inspection at this time tends to be difficult. In this embodiment, therefore, a preparation chamber 44 is provided to perform a pre-process for removing deposits, which at the least is required for the inspection. A resist ashing function, generally called an asher, is provided for the preparation chamber 44, and an oxygen plasma generator is positioned to remove a deposit consisting of resist or carbon fluoride polymer. Since the face that is exposed by etching is damaged when excessive irradiation of a sample with oxygen plasma is performed, the processing processor provides an optimal condition whereby the inspection is not adversely affected.

The wafer obtained by removing the deposit is transmitted to the inspection chamber 43 by a conveying device, such as a robot arm. In the inspection chamber 43, an inspection device employs an electron beam or light to examine the shape of the processed surface of the wafer and the bottom shape, or to determine whether electric conductivity has been obtained and whether a foreign substance is present on the bottom. As in the first embodiment, the inspection results are transmitted to the processing processor to determine whether the results obtained by the processing are satisfactory.

When the processing has not been completed as desired, a control parameter change instruction is issued to the process controller to achieve the objective, and the processing is repeated until the target processing results are obtained. In addition, the processing processor changes the etching condition so the wafer to be processed next will be handled normally.

Figure 5:
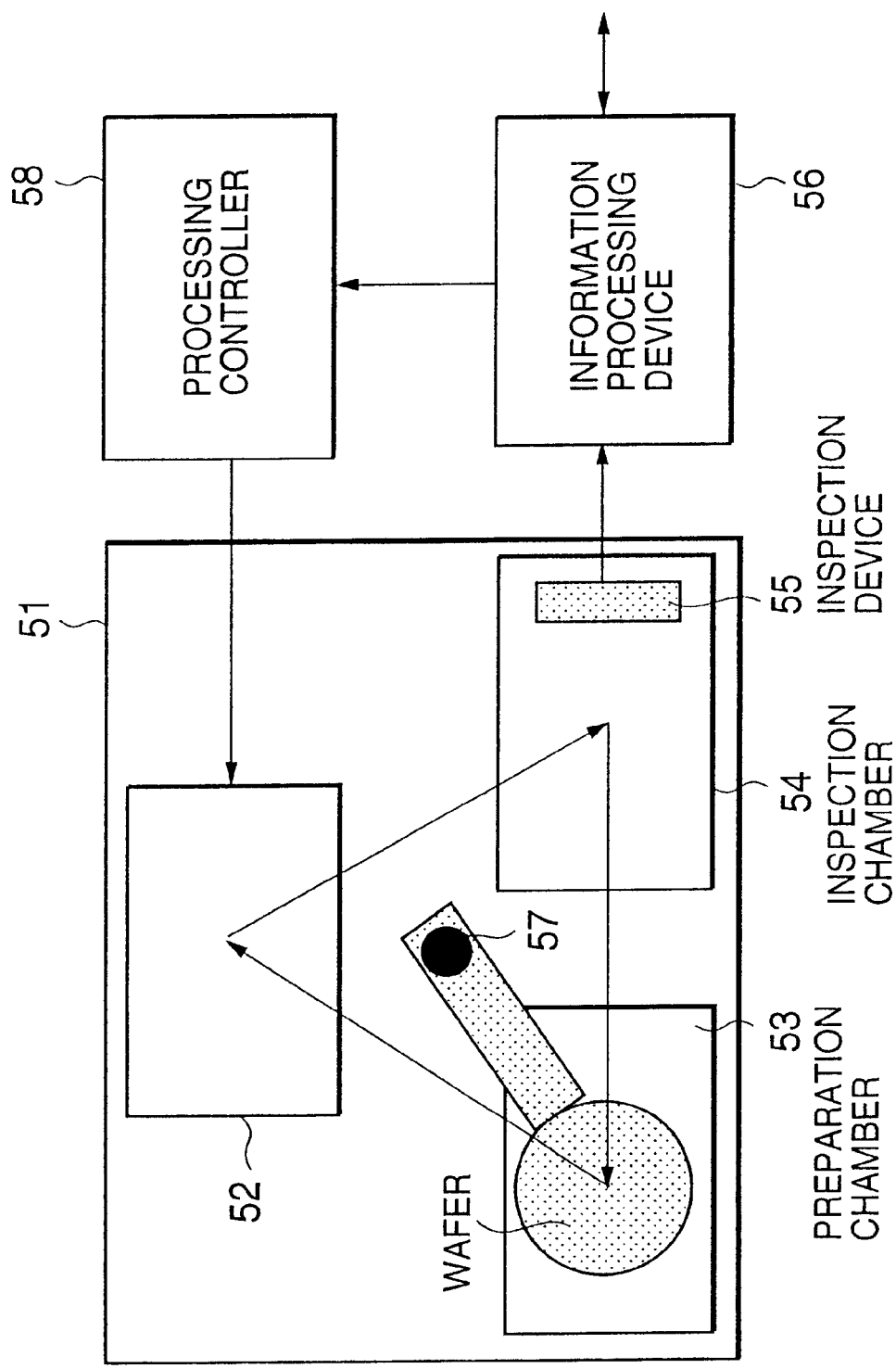
FIG. 5 is a diagram showing a CVD device to which the present invention is applied.

FIG. 5 is a diagram showing a CVD device 51 according to a fourth embodiment of the invention.

The function of the CVD device 51 is to deposit a thin film, and in the embodiment, it is used to embed a thin film on a plane, or in a groove or a hole formed in the plane. When dust is present on the surface of a substrate on which such a thin film is deposited, accordingly, the quality of the deposited thin film is deteriorated.

Therefore, first, a wafer introduced into the CVD device 51 is transmitted to an inspection chamber 54 where the presence/absence of dust on the surface is detected. When a predetermined amount of dust or more is detected, the wafer is returned to the step for removing from the surface.

When no dust is found, the wafer is transmitted to a deposition chamber 52, and a thin film is formed on its surface.

The resultant wafer is then transferred to a preparation chamber 53, and the surface of the wafer is briefly cleaned. Thereafter, the wafer is transported to an inspection chamber 54, wherein is provided an inspection device 55 that includes a device for examining surface particles generated due to laser scattering and a device for examining the thickness of a film. The results provided by the inspection are then transmitted to an information processing device 56.

When the thickness of the film falls within a reference value, the wafer is transmitted unchanged, with pertinent data, to the next step. If the thickness of the film is less than the reference, in accordance with data from the process controller 58, the wafer is again transmitted to a CVD chamber 58 whereat a film is again deposited on the wafer to obtain an appropriate film thickness. If the deposited film is too thick, the pertinent information is transmitted with the wafer to a polishing device where the wafer is polished to reduce the thickness of the film so that it falls within the range of the reference value.

When the thickness of the film affects the characteristics of the wafer, the wafer is transmitted to the next step without the film thickness being adjusted to the reference value, and the processing that is performed based on the film thickness.

A case wherein a contact hole is formed by dry etching corresponds to the above example.

Furthermore, at the same time, this information is fed back to be used as deposition condition data for the next wafer.

Figure 6:
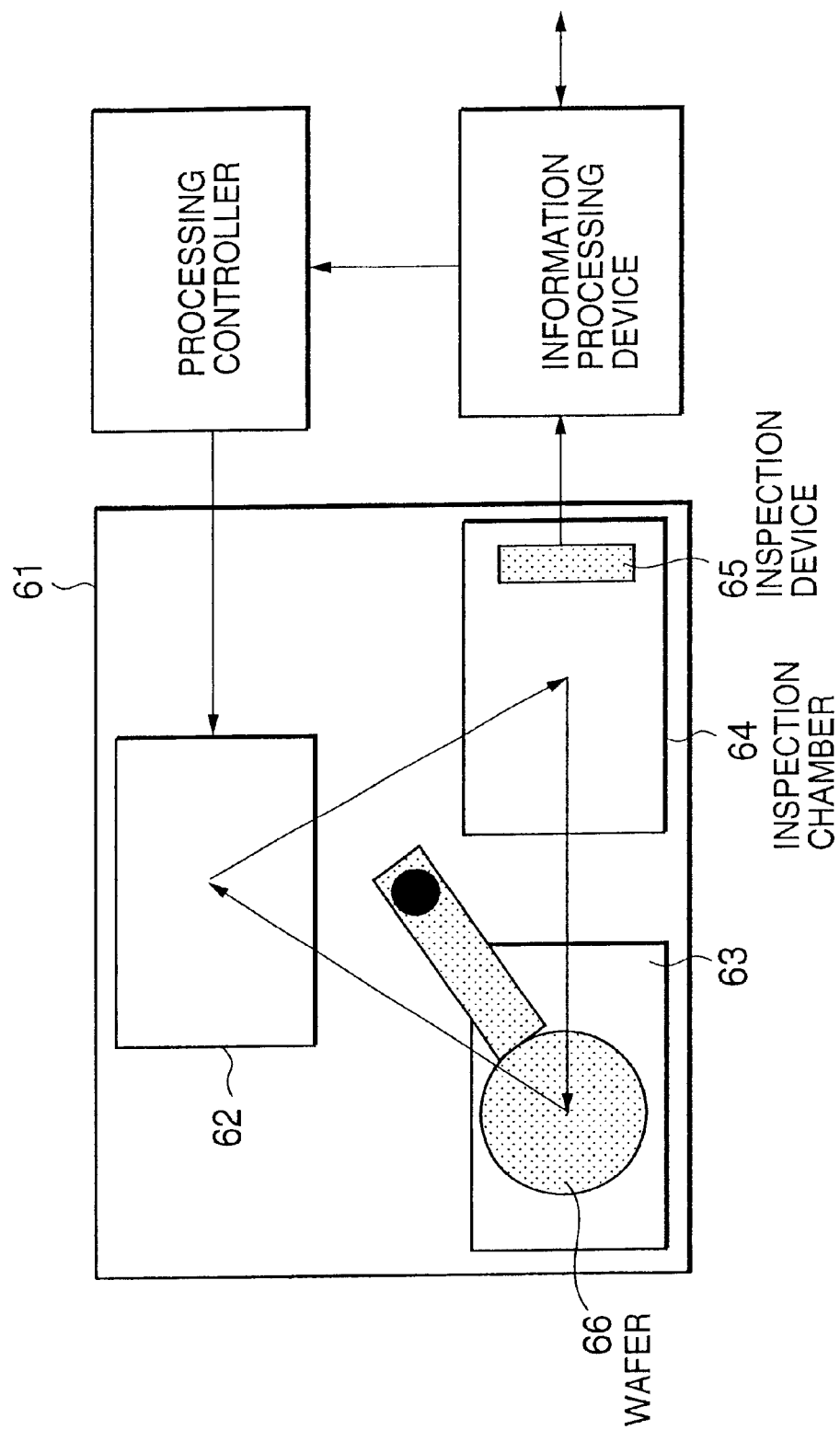
FIG. 6 is a diagram showing a CMP device to which the present invention is applied.

FIG. 6 is a diagram illustrating a CMP device 61 according to a fifth embodiment of the present invention. A wafer 66 is transported to a CMP chamber 62, and is polished until a desired film thickness is obtained.

Since the polishing is affected by the accuracy of the thickness of a support substrate, generally the film thickness of a wafer 66 obtained by polishing varies.

Since dust, such as particles, are present on the surface of a wafer immediately after polishing has been performed, the wafer 66 is introduced into a preparation chamber 63, a cleaning device, whereat the dust is removed. To remove the dust, the wafer 66 is cleaned by immersing it in a solution, or by polishing the surface of the wafer 66 using a scrubber. Since the presence of particles on the surface of a substrate adversely affect the next lithography step, a dust detector 65 employs a laser scattering method to determine whether the cleaning has been satisfactorily completed. An inspection chamber 64 includes a laser scattering device and a film thickness management device that are used to determine the whether the cleaning has been completed.

Naturally, the information concerning the thickness and the shape of the polished wafer is fed back and is used when the succeeding wafer is polished. Furthermore, this information is also forwarded and is used as an operating condition for the following steps.

Figure 7:
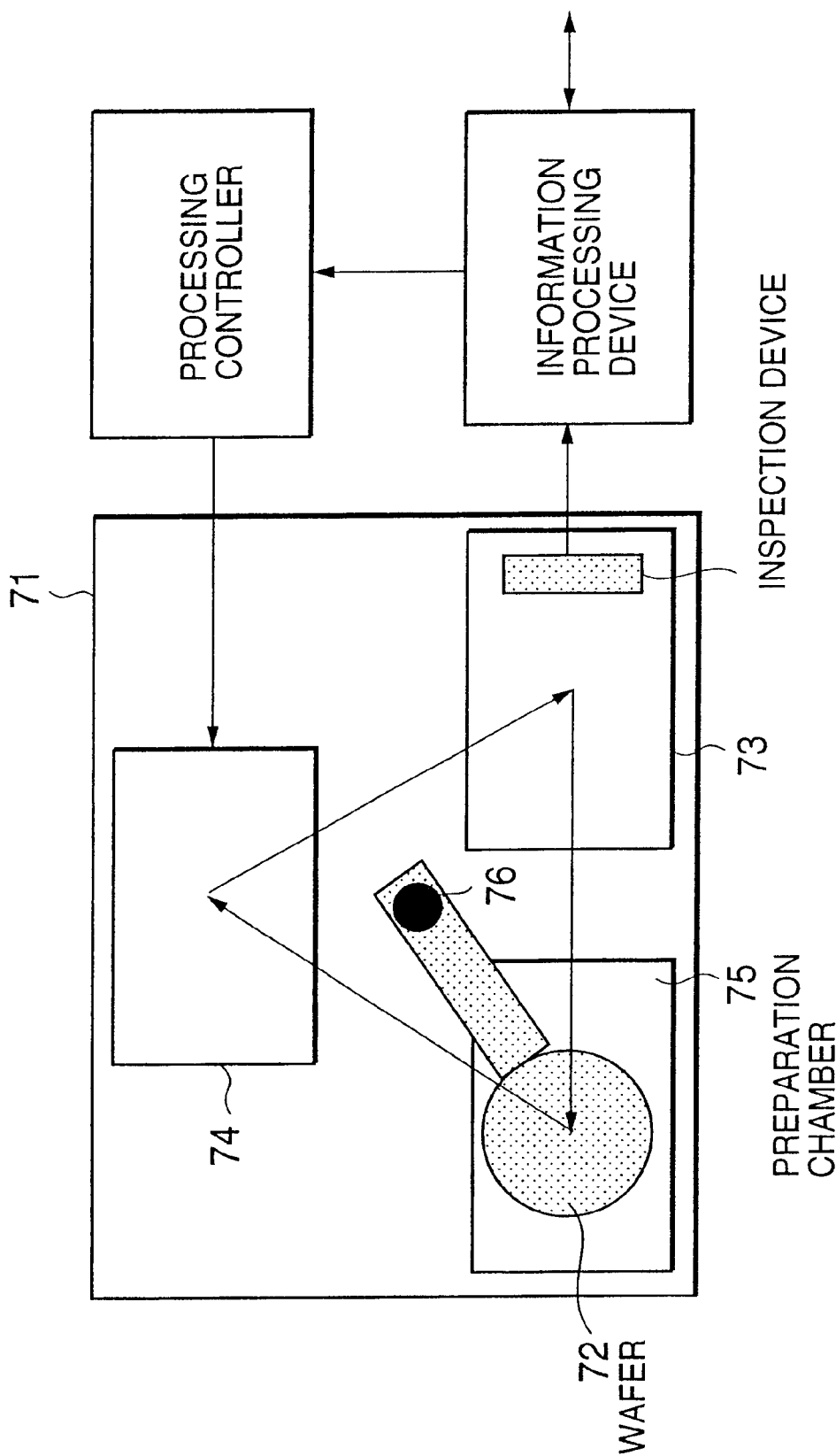
FIG. 7 is a diagram showing a sputtering device to which the present invention is applied.

FIG. 7 is a diagram illustrating a sputtering device 71 according to a sixth embodiment of the present invention. The sputtering device 71, as is the CVD device 51, is a film deposition device.

Since a film deposition failure can occur due to the presence of dust on the surface of a wafer to be sputtered, a wafer 72 that is to be introduced into the sputtering device 71 is transmitted to a measurement chamber 73, and the surface of the wafer 72 is examined. If there is dust on the surface, the wafer 72 is transported to a location where s dust removal process can be performed. For this process, a method for scrubbing the surface of a wafer is employed, or an asher is employed if the dust is an organic material. The dust removal device may be located in a preparation chamber 75.

A wafer 72 on which no dust is detected is transferred to a sputter chamber 74 by a conveying device 76. After the sputtering, the wafer 72 is conveyed to the measurement chamber 73 to examine the thickness of the film. When the film is too thin, the wafer 72 is returned to the sputter chamber 74 where sputtering is again performed to obtain a necessary thickness for the film. The information for the film thickness is transmitted with the wafer 72 to an information processing device to be used for the optimization of the next processing parameter.

Figure 8:
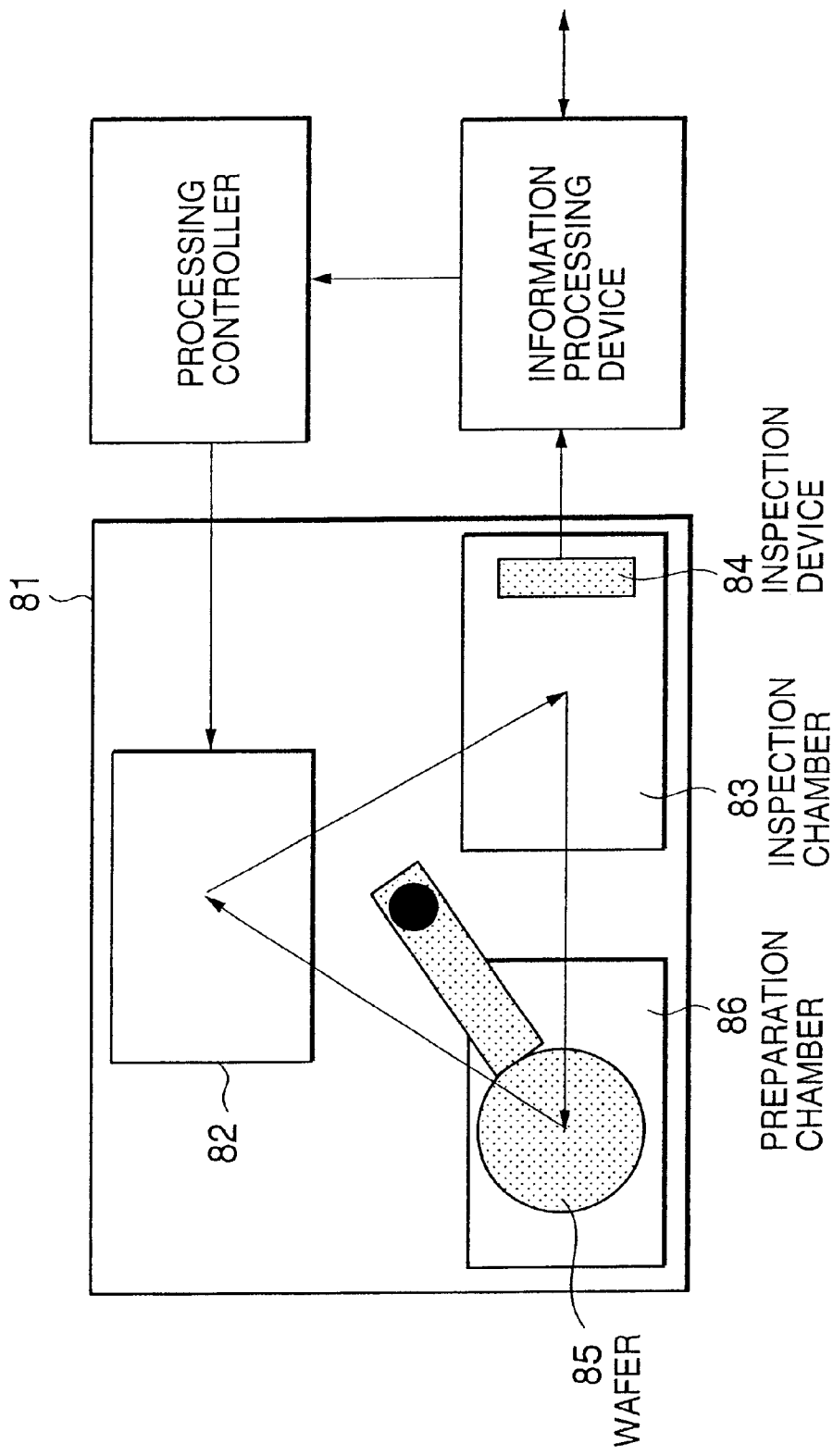
FIG. 8 is a diagram showing an ion injection device to which the present invention is applied.

FIG. 8 is a diagram showing an ion injection device 81 according to a seventh embodiment of the present invention.

For the ion injection device 81, impurity ions are injected into a substrate. When and electric charge has accumulated on the surface of the substrate, the profile of the impurity may be changed. Therefore, the surface of a wafer 85 that is introduced into the ion injection device 81 must be examined to determine whether unnecessary charges have accumulated on the surface. Thus, a charge measurement device is located in:an inspection device 3 to examine the wafer 85. If electric charges have accumulated on the surface, a charge removal device in a preparation chamber 86 is employed to remove the charges.

Ions are injected in an ion injection chamber 82. A wafer into which ions have been are injected appears the same as a wafer into which no ions have been injected. Therefore, the wafer may be erroneously identified and may be transmitted to the next step without ions being injected or after ions have been injected twice, so that a failure may occur. To prevent this, the state of the wafer after ions have been injected must be examined.

Since the permittivity of the overall wafer is changed when ions are injected into the substrate, the presence/absence of an impurity can be detected by placing an electrode on the surface and measuring the permittivity. Further, when an impurity has been injected into a comparatively large area of a wafer, and when the area is irradiated by an electron beam to examine generated X-rays, the density of the impurity can be quantitatively examined. The density of the impurity may also be examined by using a change in the absorption rate of light having a specific wavelength. An inspection device 84 for such an examination is located in an inspection chamber 83.

Figure 9:
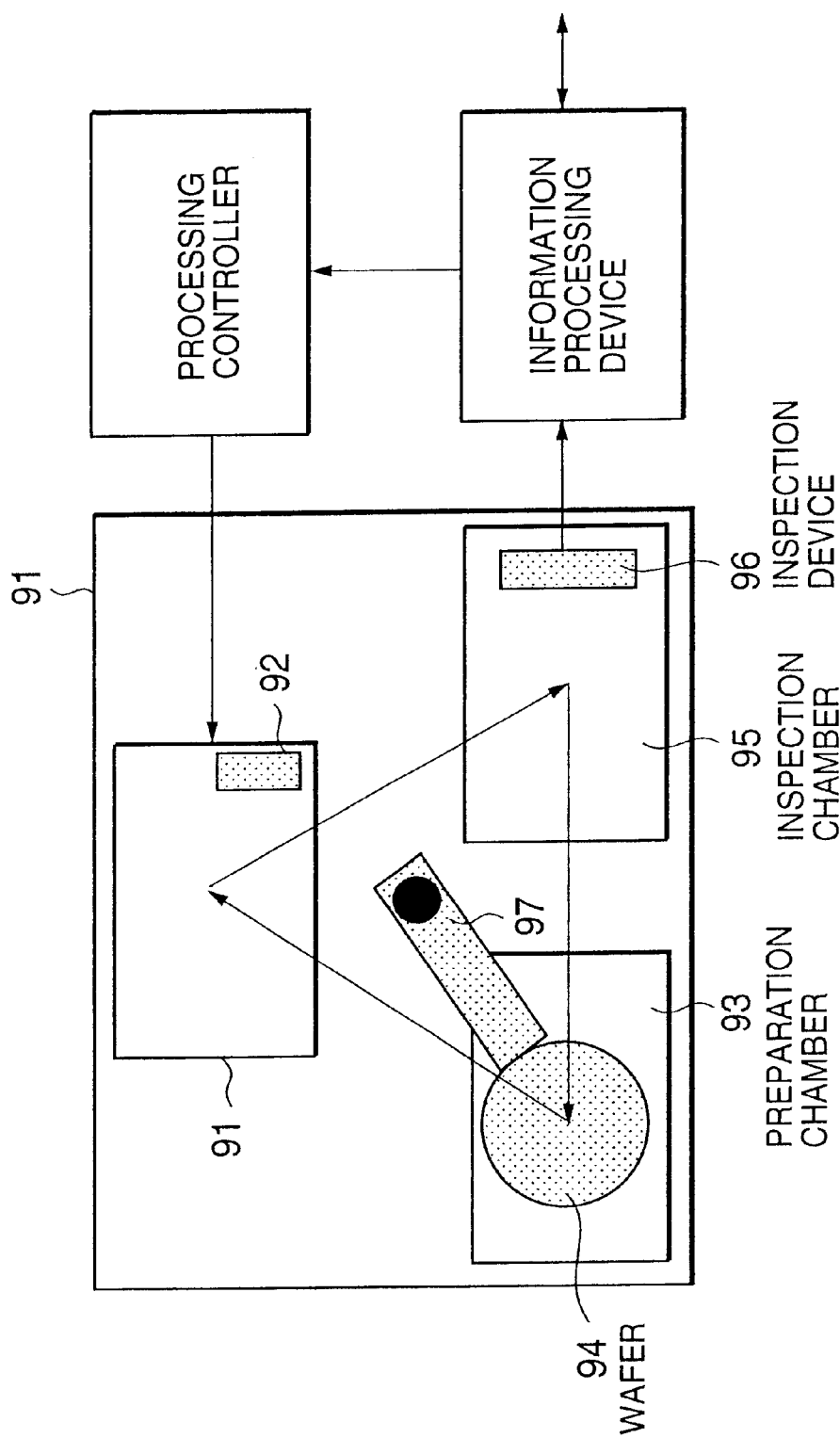
FIG. 9 is a diagram showing a plasma stripping device to which the present invention is applied.

FIG. 9 is a diagram showing a plasma stripping device 91 according to an eighth embodiment of the present invention.

The plasma stripping device 91 is used to remove an organic material, such as a resist. The plasma stripping device 91 employs an operation principle according to which, to remove a resist present on a silicon wafer 94, the resist is oxidized and changed into carbon dioxide by using oxygen plasma. However, the intensity of the plasma application or the length of the processing time must be changed, depending on how the resist is attached.

When generally the resist is burnt into the oxygen plasma, light, accompanied by the oxidization of carbon, is generated. Thus, a light sensor 92 is located inside the plasma stripping device to measure the color of the plasm and to detect the terminal point for stripping.

A wafer 94 that has been stripped is temporarily located in a preparation chamber 93 to adjust the time, and then is transported from the preparation chamber 93 to an inspection chamber 95. The foreign substance on the surface of the wafer 94 is examined by a dust inspection device that uses a laser scattering method, or by an inspection device 96 that examines the surface to detect the presence/absence of carbon.

When the only dust or carbon that is found is equal to or lower than a reference level, the plasma stripping is regarded as having been completed, and the wafer 94 is automatically conveyed to the next step.

When the stripping has been incompletely performed, the wafer 94 is returned to the plasma stripping chamber 91 by an automatic, internally provided conveying device 97, and the stripping process is performed again. The above described process is repeated until the stripping has been completed in consonance with the objective.

Figure 10:
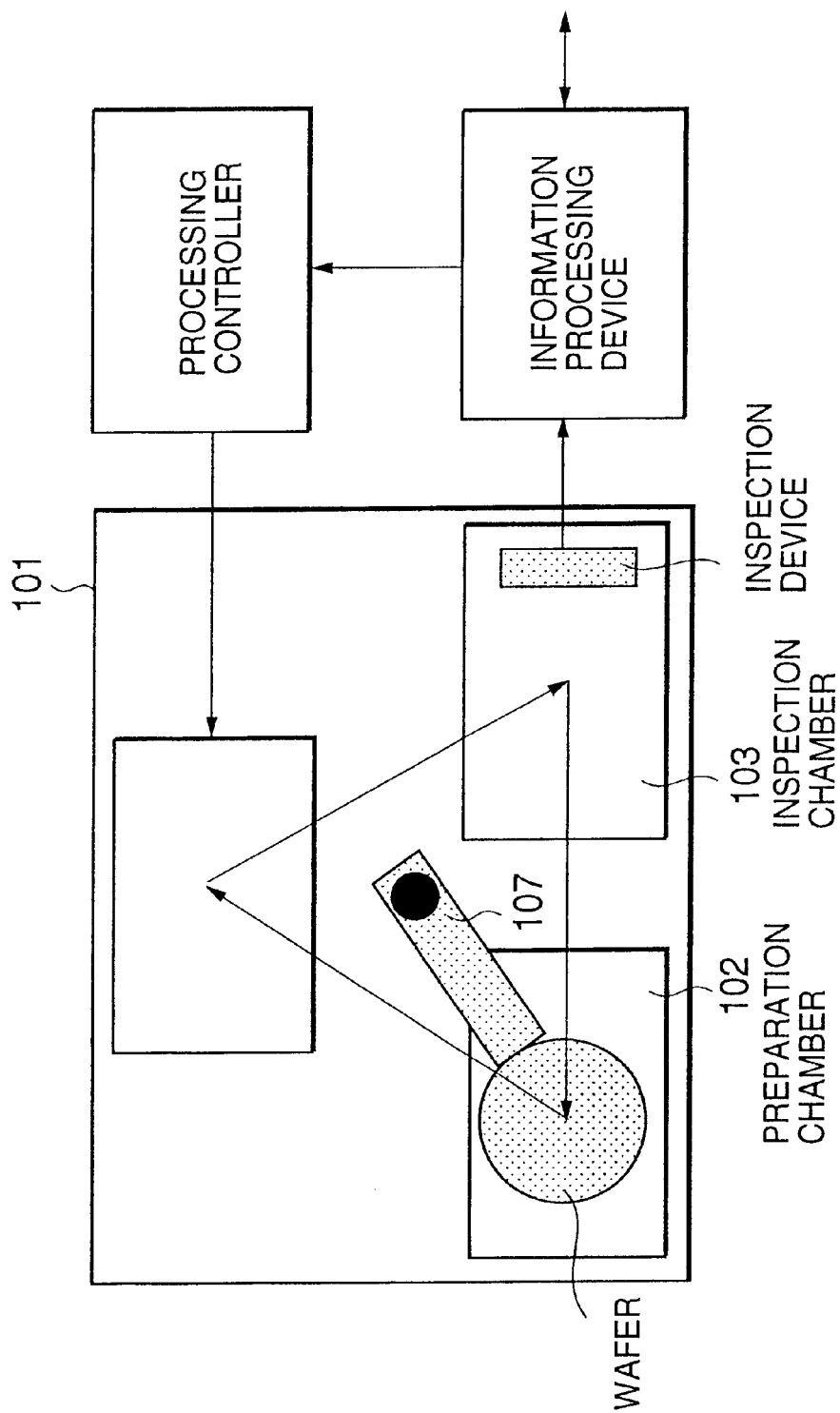
FIG. 10 is a diagram showing a wet cleaning device to which the present invention is applied.

FIG. 10 is a diagram showing a wet cleaning device 101 according to a ninth embodiment of the present invention.

The wet cleaning device 101 is used to clean the surface of a wafer that is introduced, to remove an organic material before the wafer is inserted into an electric furnace, to remove a foreign substance in a hole that can not be completely removed by a plasma stripping device that removes a resist, and to remove particles or wiring dust that are attached to the surface of the wafer during the CMP process.

Since a wafer processed by the wet cleaning device is wet, no measurements can be conducted. Thus, first, in a preparation chamber 102 spin drying is performed to remove water from the surface of the substrate. Then, while the temperature is raised to 100 degrees, as needed, the air is exhausted from the preparation chamber 102 to form a vacuum, and a process is performed to remove all water from the surface of the substrate. Thereafter, the substrate is delivered to an inspection chamber 103 by a conveying device 107 to determine whether a foreign substance is present on the bottom of the hole and to measure the diameter of the opening of the hole and the diameter at the bottom of the hole.

Figure 11:
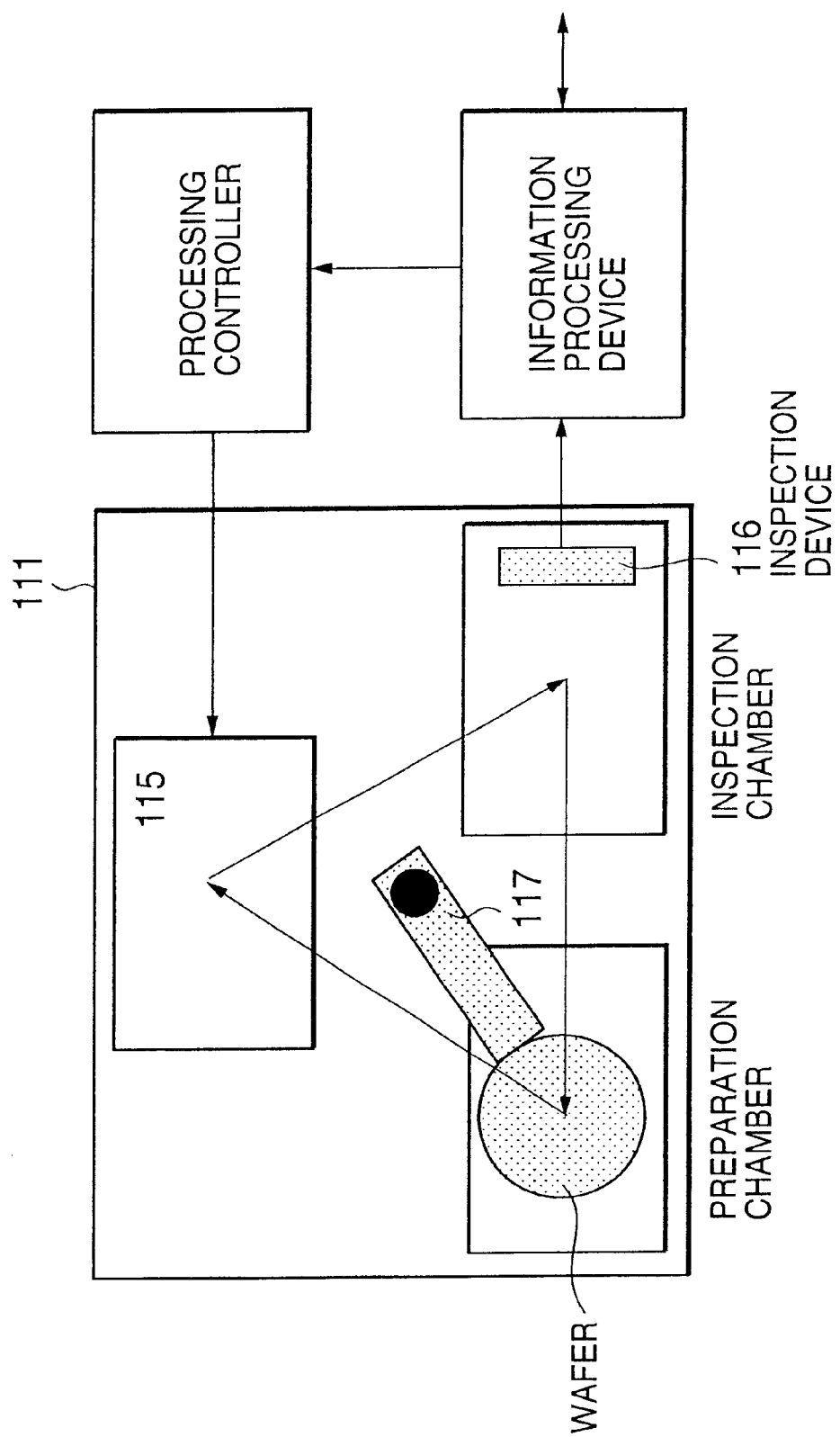
FIG. 11 is a diagram showing a plating device to which the present invention is applied.

FIG. 11 is a diagram showing a plating device 111 according to a tenth embodiment of the present invention.

The plating device 111 is used for copper wiring.

A seed layer that serves as a seed for plating is formed in advance on a substrate by sputtering or by using the CVD, and electric plating is performed thereon.

A plating thickness and a plating material are employed to manage the plating, for which various plating methods are available. For electric plating, which is normally used to form wiring, the copper to be precipitated must have a very high purity rating, even though it may more or less contain hydrogen, and according to the Farady principle, the plating thickness can be strictly calculated using a Coulomb volume required for plating. Therefore, in the processing for applying plating having a constant thickness, when a ratio of the Coulomb volume and the total plating weight reaches a certain level, or when an electric resistor having a specific shape is measured, the quality of the plating material or the plating thickness can be examined.

Therefore, a Coulomb meter 114 is provided in a plating chamber 115 to measure the electric charges used for precipitation. In the inspection chamber, a device 116 is provided to determine whether a rough surface due to hydrogen bubbles is formed.

An inspection device for measuring sheet resistance may also be provided.

Figure 12:
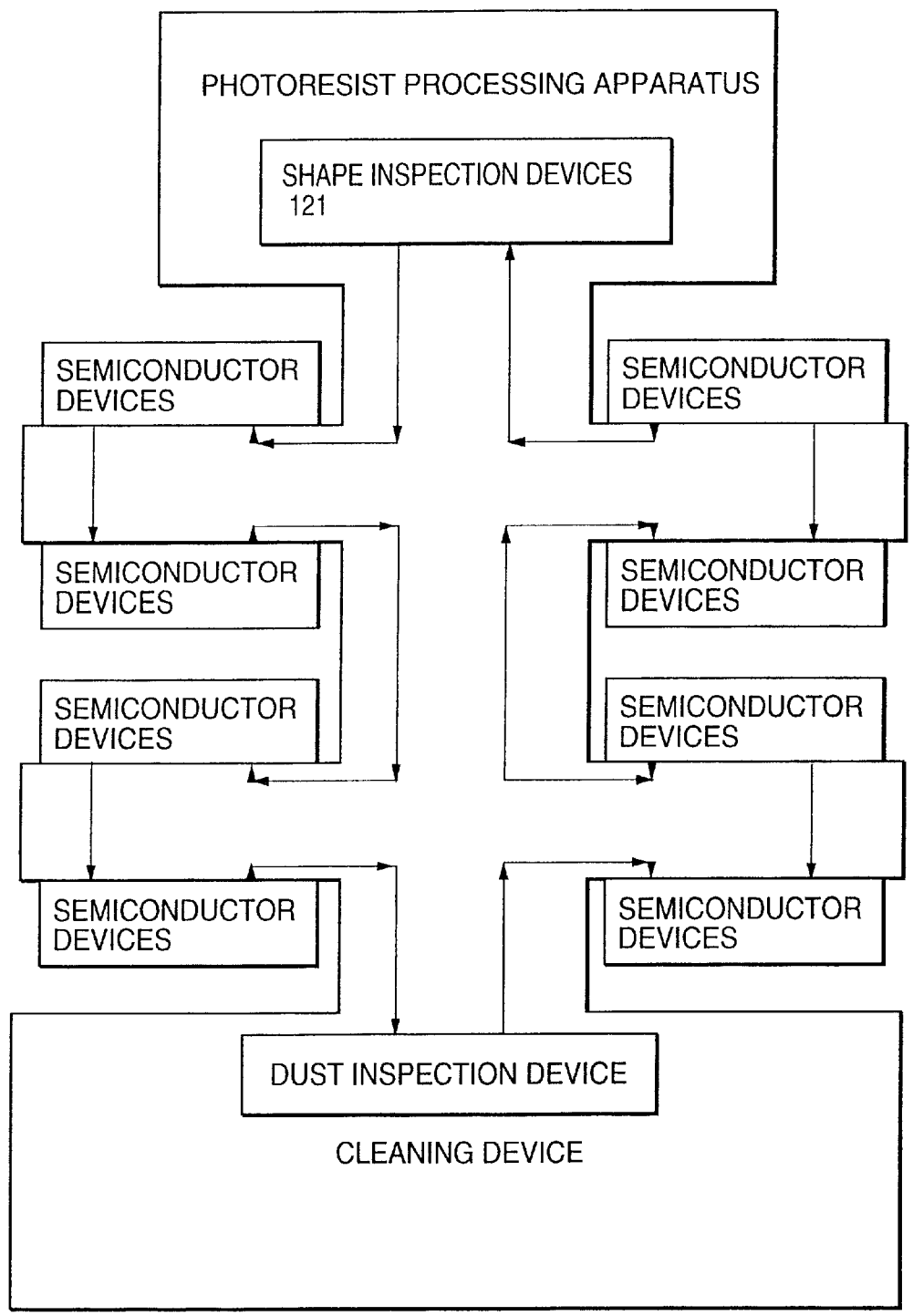
FIG. 12 is a specific diagram showing a semiconductor production line according to the present invention.

FIG. 12 is a specific diagram showing one semiconductor production line.

The detailed shapes provided by semiconductor manufacturing processing are substantially determined during the resist process. Therefore, a shape inspection device 121 is located near a photoresist processor in order to determine whether a photoresist having a correct shape can be obtained.

The substrate on which the photoresist pattern is formed is passed through various semiconductor devices and is finally transmitted to the resist stripping step, whereat the resist is completely stripped off by the cleaning device. In this state, dust attached to the surface of the wafer or the state of the bottom of the hole is examined.

Figures 13, 14:
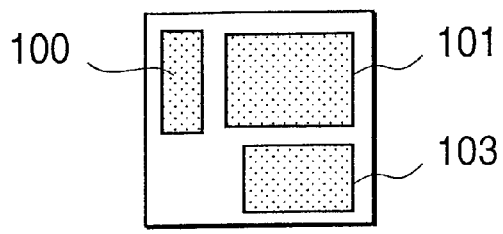
FIG. 13 is a specific diagram showing a chip.
FIG. 14 is a diagram showing example data obtained by an inspection apparatus according to the present invention.

FIG. 13 is a diagram showing a circuit block that is incorporated in the type of chip that is generally manufactured. Each block includes an analog circuit 100, a processor 101 and a memory 103, all of which have a featured size for each block.

Generally, while for simplification of the processing a pattern is formed for each block in accordance with the same rule, the margins of the circuits that constitute the block differ. Therefore, a construction process is required for inspection, so that a special, high-speed logic circuit having a small margin can be accurately formed. The inspection device provided for the etching device, for example, obtains and accumulates the data shown in FIG. 14 for each wafer.

For example, during the processing for forming a one micron oxide film, when there is a 10% change in the thickness of the oxide film, the diameter at the bottom of a hole that is formed with an inclination of 88 degrees is changed at least 30%. Since this change results in a nearly twofold change in the area of the hole, the magnitude of a current that flows across the hole is greatly altered.

In a high-speed logic circuit, a change in hole resistance directly affects the signal transmission speed, and the circuit operation is destablized or is disabled. In this case, when the thickness of the film exceeds the reference value, the etching need only be performed while the inclination angle of the etching is changed so it is greater than 88 degrees. Then, the area at the bottom of a hole will be substantially the same as when the thickness of the film was one micron, and the circuit requesting standard will be satisfied.

Figure 15:
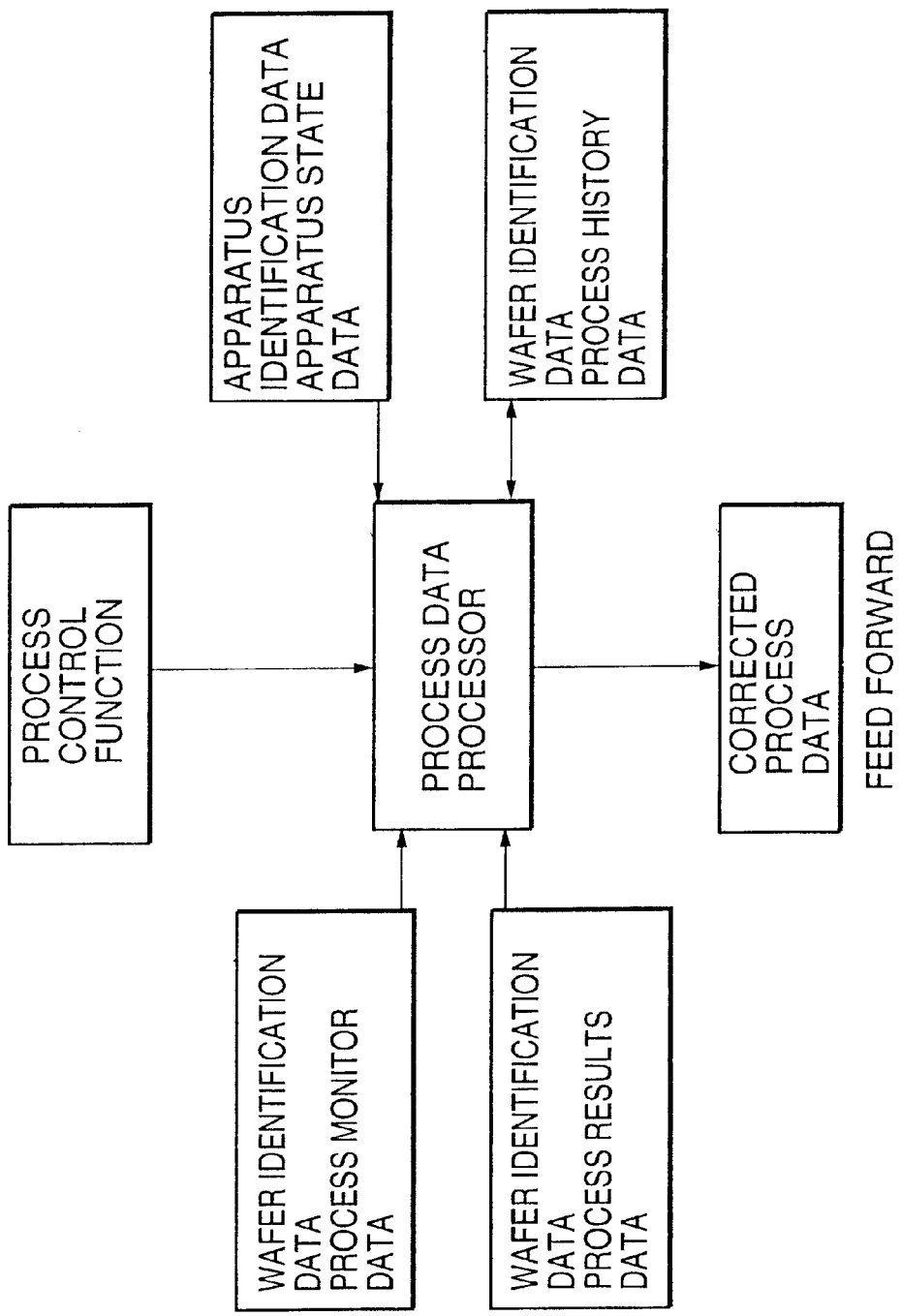
FIG. 15 is a diagram showing an arrangement for a process data processor according to the present invention.

As is described above, according to the present invention, with the arrangement shown in FIG. 15, a processing processor can perform calculations and can control a processing apparatus by using a processing parameter as corrected processing data. As a result, wafer history data, apparatus state data and data obtained from the processing results can be integrated so as to manufacture as many superior products as possible during the current processing.

There is a case where data that are transmitted forward to the next step and data that are fed back for the next wafer are not specifically shown; however, what data are required for these steps would be readily apparent to one having ordinary skill in the art.

According to the embodiment, a wafer on which dust was previously deposited and is still present, on which a misshapen pattern is deposited can be identified when it is introduced into a processing apparatus. Therefore, it is possible to prevent the occurrence of a phenomenon and a processing failure, even when the processing has been performed normally. Further, when a failure is detected, an affected wafer is automatically returned to the preceding process, so that the failure occurrence rate can be reduced.

Further, since the state of a wafer that has just been processed is examined, the occurrence of a processing failure can be immediately detected. Further, since these states are recorded, the cause of a failure can be specified. Furthermore, a target process can be completed while taking into consideration the history of a current wafer and the current state of the apparatus.

Since the conveying device automatically determines the next process in accordance with the processed state of the wafer, and automatically transmits the wafer to the processor, the target process results can be obtained without the intervention of humans being required.

Although the invention has been described by referring to specific embodiments, from this it should not be construed that the description is intended to in any way limit the application of the invention. Furthermore, since when reading the description of the invention while referring to the accompanying drawings, various modifications of the disclosed embodiments will become apparent to persons skilled in the art, it is therefore contemplated that the true scope of the invention is as set forth in the appended claims.

What is claimed is:

1. A semiconductor manufacturing apparatus, which performs predetermined processing for a group of wafers supplied by a pre-processor that performs preliminary processing, comprising:
   a data storage unit for storing wafer processing history data received from said pre-processor;
   a target value storage unit for storing a processing target value for said semiconductor manufacturing apparatus;
   an identification unit for identifying a wafer supplied by said pre-processor based on identification information located on said wafer;
   a processor for employing said wafer processing history data and said processing target value to determine processing conditions for said wafer identified by said identification unit;
   a conveying unit for transporting said wafer from said identification unit to a wafer processor;
   a controller for controlling said wafer processor in accordance with said wafer processing conditions instructed by said processor; and
   a determination unit for examining the condition of said wafer that has been processed by said wafer processor to determine whether said wafer is good or bad,
   wherein, in accordance with the results obtained by said determination unit, said processor unit determines whether the processing of said wafer is to again be performed by said wafer processor, and as necessary, again sets said processing conditions.

2. A semiconductor manufacturing apparatus according to claim 1, wherein said determination unit includes:
   an inspection device for examining the state of said wafer; and
   a results determiner for comparing inspection data obtained by said inspection device with target data to determine whether said inspection data is satisfactory.

3. A semiconductor manufacturing apparatus according to claim 2, wherein said identification unit, said wafer processor and said inspection device are integrally located within a range wherein said wafer is conveyed by said conveying unit.

4. A semiconductor manufacturing apparatus according to claim 1, further comprising:
   an accumulator for, in accordance with wafer identification numbers, automatically and sequentially accumulating the state of said wafer before a series of processes are performed for said wafer, the state of said apparatus that has processed said wafer, and the state of said wafer that has been processed.

5. A semiconductor manufacturing apparatus according to claim 1, wherein said conveying unit comprises a robot arm.

6. A semiconductor manufacturing apparatus comprising:
   an inspection unit for detecting dust or a pattern defect present on a wafer that is input to a semiconductor processing apparatus;
   an identification unit for identifying a wafer supplied by said pre-processor based on identification information located on said wafer; and
   a changing unit for employing the inspection results obtained by said inspection unit to change the location to which said wafer that has been examined is to be conveyed,
   wherein said inspection unit and said changing unit are internally provided for said semiconductor processing apparatus.

7. A semiconductor manufacturing apparatus according to claim 1, wherein said identification information is stored in a bar code.

8. A semiconductor manufacturing apparatus according to claim 1, wherein said identification information is etched onto said wafer.

9. A semiconductor manufacturing apparatus according to claim 6, wherein said identification information is etched onto said wafer.

10. A semiconductor manufacturing apparatus according to claim 6, wherein said identification information is etched onto said wafer.

* * * * *